United States Patent [19]
Wallrafen

[11] Patent Number: 5,092,171
[45] Date of Patent: Mar. 3, 1992

[54] ACCELERATION SENSOR WITH DIFFERENTIAL CAPACITANCE

[75] Inventor: Werner Wallrafen, Sulzbach, Fed. Rep. of Germany

[73] Assignee: VDO Adolf Schindling AG, Frankfurt am Main, Fed. Rep. of Germany

[21] Appl. No.: 531,033

[22] Filed: May 31, 1990

[30] Foreign Application Priority Data

Jun. 13, 1989 [DE] Fed. Rep. of Germany ....... 3919190
Jun. 13, 1989 [DE] Fed. Rep. of Germany ....... 3919191

[51] Int. Cl.$^5$ .................................... G01P 15/125
[52] U.S. Cl. ........................................ 73/516 LM
[58] Field of Search ............... 73/516 LM, 304 C; 33/366; 324/660, 661

[56] References Cited

U.S. PATENT DOCUMENTS

| | | | |
|---|---|---|---|
| 2,354,964 | 8/1944 | Ostermann et al. | 73/304 C |
| 4,010,650 | 3/1977 | Piatkowski | 73/304 C |
| 4,624,140 | 11/1986 | Ekchian et al. | 33/366 |
| 4,642,555 | 2/1987 | Swartz et al. | 324/677 |

Primary Examiner—John E. Chapman
Attorney, Agent, or Firm—Martin A. Farber

[57] ABSTRACT

In an acceleration sensor, in particular for automobiles, at least two electrodes which are surrounded by a dielectric are arranged, substantially parallel to each other, in a housing and immersed over part of their length in an electrically conductive liquid. Flip-flops output pulses having durations based on capacitance of the sensor. Output signals of the flip-flops are combined arithmetically.

17 Claims, 4 Drawing Sheets

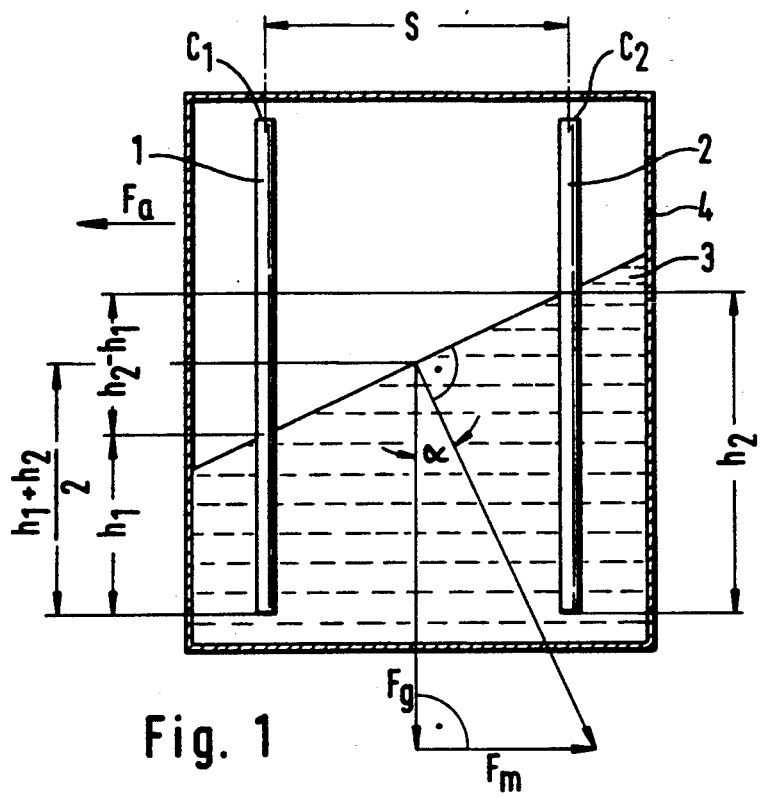
Fig. 1
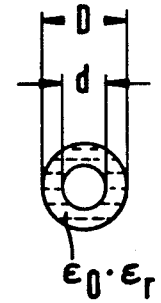
Fig. 2
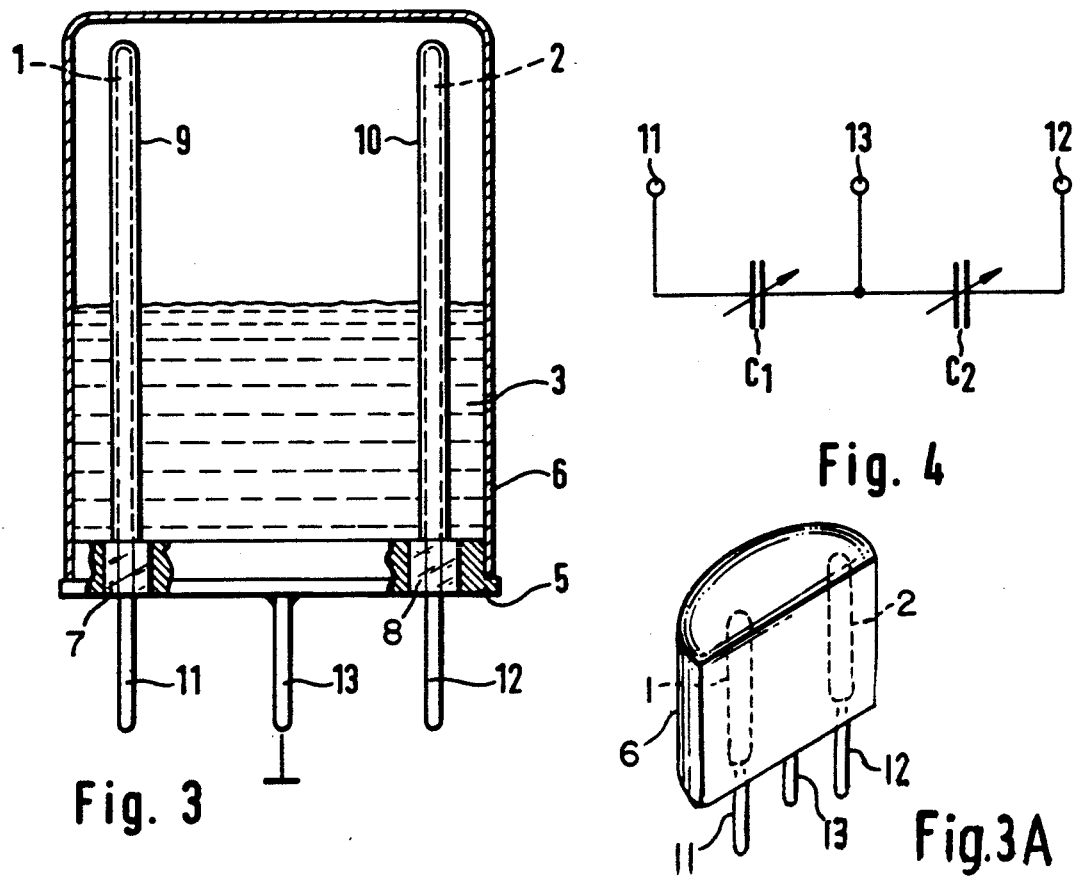
Fig. 3
Fig. 4
Fig. 3A a)

b)

c)

d)

4,092,171

ACCELERATION SENSOR WITH DIFFERENTIAL CAPACITANCE

FIELD AND BACKGROUND OF THE INVENTION

The present invention relates to an acceleration sensor, in particular for automobiles.

For the conversion of acceleration values into electrical signals, capacitive acceleration sensors having plate-shaped electrode arrangements are known in which by means of a seismic mass under the effect of an acceleration, the distance between the plates is changed or the plates are rotated or displaced similar to a rotary capacitor. A measurement of the capacitance then gives the acceleration which is to be determined. These known sensors, however, have very small capacitances, so that the evaluation encounters circuit difficulties. Furthermore, a seismic mass is required. The temperature sensitivity of the slope of the characteristic curve is frequently high. Furthermore, mechanically complex constructions are required which do not permit high shock-resistances. Also, in the known sensors, the stability of the zero point suffers under the effect of temperatures and overloads. Finally, linear characteristic curves can be obtained only at relatively high expense.

SUMMARY OF THE INVENTION

It is an object of the invention to provide an acceleration sensor which operates reliably and accurately and can be manufactured at low cost. The acceleration sensor of the invention furthermore is to make possible a simple evaluation of the output signal.

According to the invention, at least two electrodes (1, 2) which are surrounded by a dielectric (9, 10) are arranged substantially parallel to each other within a housing (4), a part of their length dipping into an electrically conductive liquid (3).

In this connection, it is preferably provided that each of the electrodes (1, 2) is connected to a separate device for measuring the capacitance present between the electrode and the liquid, and that the devices for measuring the capacitance are connected at the output to a subtraction circuit.

The acceleration sensor of the invention does not require a solid seismic mass nor any elements to be deformed mechanically such as torsion beams with strain gauges or quartzes, which change their properties due to changes in temperature, aging or overstressing. The acceleration sensor of the invention can be produced as a compact part of small size with high shock resistance and high zero-point stability. This part can, on the one hand, be produced at low cost. On the other hand, a printed circuit board which bears an evaluation circuit can be provided directly with the acceleration sensor of the invention. Further advantages of the acceleration sensor of the invention consist of its symmetrical construction, a high change in capacitance which makes a simple evaluation circuit possible, a wide range of operating temperatures, a linear characteristic curve, very low temperature dependence and good electromagnetic compatibility.

The above-mentioned advantages of the acceleration sensor of the invention make it possible, in particular, to use it in an automobile, in order, for instance, to control the damping of the chassis. Its application is, however, not limited to this purpose but it can also be used, for instance, in aircraft and water vehicles.

One advantageous development of the acceleration sensor of the invention provides two electrodes (1, 2) which extend parallel to each other and are covered over about half their length with liquid (3).

In this connection the housing (4) preferably has the shape of a semi-circle and a greater extension in the plane formed by the electrodes (1, 2) than perpendicular to that plane. This embodiment makes a particularly compact part possible, which is inexpensive, in particular if the housing is a commercially available oscillating quartz housing.

In order to measure the acceleration in several directions, several - preferably three or four - parallel electrodes, in accordance with a further development of the invention, are provided to form different planes in pairs. Also the invention can provide, for the measurement of the acceleration in several directions, one acceleration sensor with two electrodes for each direction.

The conducting liquid should have low adhesion forces with respect to the inner wall of the housing so that hysteresis influences become negligible. It is furthermore advantageous to adapt the cooperation with the cohesive forces in such a manner that the liquid level is not influenced by capillary action due to the small distance between electrode and housing.

According to a feature of the invention, the electrodes (1, 2) are coated with the dielectric (ceramics, glass, or insulating varnish) in such a manner that a high dielectric coefficient and high tightness to the liquid result.

An acceleration sensor in accordance with the invention which has an advantageous evaluation circuit is characterized by the fact that two monostable flip-flops (14, 15) are provided, that the resistance or capacitance values of the acceleration sensor determine the time constants of the monostable flip-flops (14, 15), and that in each case one output of one monostable flip-flop is connected to a setting input (trigger) input of the other monostable flip-flop in such a manner that by passage of in each case, one monostable flip-flop (14; 15) into the stable state, the corresponding other monostable flip-flop (15; 14) passes into the unstable state. The outputs of the monostable flip-flops (14, 15) are preferably connected here to the trigger inputs via differentiating circuits (16, 17; 18, 19).

This evaluation circuit is characterized by a low expense and it produces a binary output signal which can be further processed in simple manner both by a microprocessor and by a simple analog circuit. Another advantage is that information concerning both sensor variables can be sent out over one signal line. However, a symmetric output of the evaluation circuit can also be utilized, which results in good electromagnetic compatibility.

For the further processing of the output signal, an output signal of at least monostable flip-flop (14; 15) can, in accordance with a further development of the evaluation circuit, be fed to an integrator (22: 23; 24, 25). Furthermore, the transmission of an analog signal to a further-processing circuit is possible in the manner that the output signal of a monostable flip-flop can be fed directly to a first integrator and, inverted, to a second integrator and that the outputs of the integrators are connected to the inputs of a subtraction circuit. In this way, a simple asymmetric binary interface is created between the evaluation circuit present in the immediate vicinity of the sensor and a circuit for the further processing of the output signal of the evaluation circuit.

A symmetric binary interface is formed in the manner that each of the output signals of the monostable flip-flop (14, 15) can be fed to a separate integrator (22, 23; 24, 25; 33, 34) and that the outputs of the integrators are connected to the inputs of a subtraction circuit (35; 39).

Further according to the invention, the output signal of one monostable flip-flip (14) can be fed directly to a first integrator (31, 32) and, inverted, to a second integrator (33, 34) and the outputs of the integrators are connected to inputs of a subtraction circuit (35).

Still further according to the invention, the oscillation of at least one monostable flip-flop (14, 15) is monitored and, upon absence of the oscillation, at least one monostable flip-flop (14, 15) is again placed into the unstable state via the corresponding trigger input.

Still further according to the invention, the oscillation of the circuit is monitored by a logical OR connection of the two output signals of the monostable flip-flops (14, 15).

Circuits consisting of two monostable flip-flops which place each other into the unstable condition may possibly not oscillate again after a disturbance, for instance due to a brief short-circuiting of one of the output signals. In order to make dependable restarting of the oscillation possible even in such a case, the evaluation circuit can be further developed in the manner that the differentiating circuits consist of one capacitor (16, 18) each and one resistor (17, 19) each which is connected to a terminal (41) for the operating voltage, and that both terminals of the capacitors (16, 18) belonging to the differentiating circuits are connected via one diode each (51, 52, 55, 56) to a resistor (53) the terminal of which facing away from the diodes is acted on by ground potential.

BRIEF DESCRIPTION OF THE DRAWINGS

With the above and other objects and advantages in view, the present invention will become more clearly understood in connection with the detailed description of preferred embodiments, when considered with the accompanying drawing, of which:

FIG. 1 is a diagrammatic showing of the manner of action of the acceleration sensor of the invention;

FIG. 2 is a view of the coaxial capacitor formed of an electrode, a dielectric and the liquid;

FIG. 3 is a longitudinal section through the embodiment;

FIG. 3A shows a semicircular shape to a housing of the sensor;

FIG. 4 is an equivalent circuit diagram of the embodiment;

Identical parts in the figures have been provided with the same reference numbers.

DETAILED DESCRIPTION OF THE PREFERRED EMBODIMENT

Figure 5:
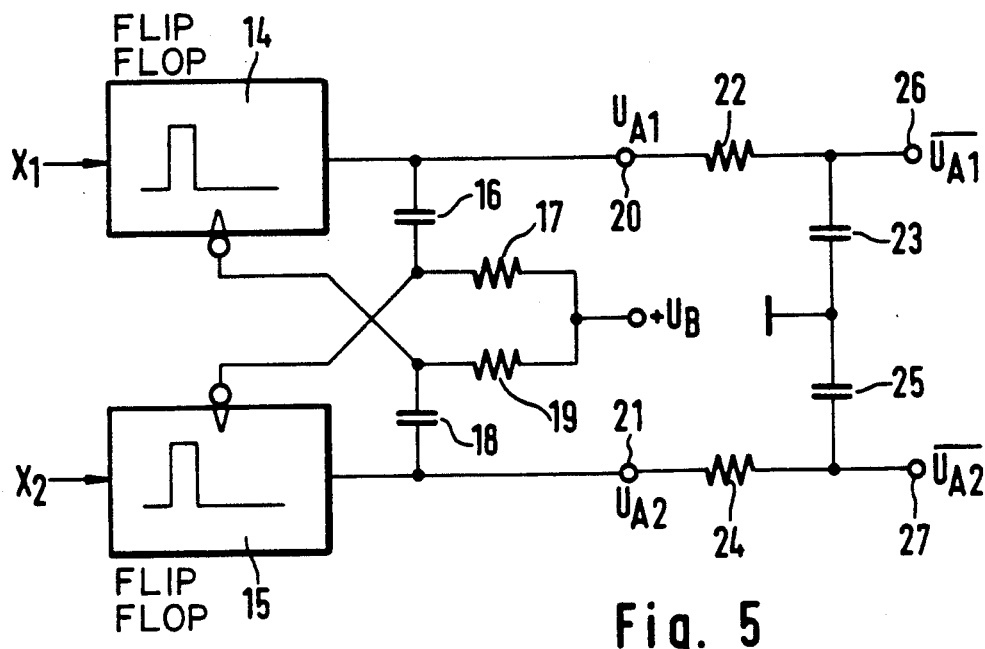
FIG. 5 is a block diagram of an evaluation circuit for the acceleration sensor of the invention.

In the diagrammatic showing of FIG. 1, two round, elongated electrodes 1, 2 which are coated with a dielectric, not shown in FIG. 1, are immersed in an electrically conductive liquid 3. An acceleration a acting on the housing 4 in the direction of the arrow causes an oblique positioning of the liquid level by the angle $\alpha$. As a result, the electrode 1 is covered by liquid merely up to the level $h_1$ while the liquid rises to $h_2$ at the electrode 2. The average liquid level is $(h_1+h_2)/2$. As can be noted from the triangle of forces also shown in FIG. 1, we have, for the angle $\alpha$, $\tan \alpha = F_m/F_g$, in which $F_m$ is the force of inertia counteracting the acceleration force $F_a$ and $F_g$ is the weight.

The dielectric on the electrode surface forms a capacitor between each of the electrodes 1, 2 and the conductive liquid, the capacitor being shown diagrammatically in FIG. 2. The capacitance of such a coaxial capacitor is $$C = [\pi \epsilon_0 \epsilon_r / (\ln D/d)] \cdot h.$$

In this equation, D is the outside diameter of the dielectric, d is the diameter of the electrode, and h is the liquid-covered height of the electrode in question.

For the difference in the capacitances, we then have:

$$C_2 - C_1 = [2\pi \epsilon_0 \epsilon_r / (\ln D/d)] \cdot (h_2 - h_1)$$

As can be noted readily from the triangle of forces shown in FIG. 1, $$h_2 - h_1 = s \cdot (a/g),$$

in which a is the acceleration transverse to the acceleration of gravity g and s is the distance between electrodes 1 and 2. There then results, for the standardized acceleration the equation $$a/g = (C_2 - C_1) \cdot (\ln D/d) / 2\pi \epsilon_0 \epsilon_r s.$$

It can be noted in this connection that the value a obtained by the measurement of the difference in capacitances is independent of the height of filling $(h_1+h_2)/2$, but is dependent on $\epsilon$. according to a further development of the invention, there is, however, the possibility, upon the evaluation, of dividing the difference by the sum of the capacitances. We then have for the standardized acceleration $$a/g = (C_2 - C_1) \cdot (C_2 + C_1) \cdot (h_1 + h_2)/s$$

The result of the measurement is in this case independent of $\epsilon$ but dependent on the height of filling. This has, for instance, the advantage that a temperature dependence of $\epsilon$ does not enter into the result of the measurement.

In the embodiment shown in FIG. 3, the two electrodes 1 and 2 are held by the bottom 5 of a metal housing 6 obtainable for oscillating quartzes. Glass leadthroughs 7, 8 are provided for insulation. The housing is sealed hermetically by corresponding soldering. The liquid 3 covers about one-half of the electrodes 1, 2. Extensions of the electrodes 1, 2 serve at the same time as soldering pins 11, 12. A third soldering pin 13 connected directly to the housing bottom 5 forms the common counterelectrode.

The soldering pins 11 to 13 are arranged in a standard grid so that the acceleration sensor can be mounted directly on a printed circuit board. The acceleration sensor shown in FIG. 4 can possibly be used with the terminals 11 to 13 facing upward. As a result, the region of the passage of the electrodes 1, 2 through the housing bottom 5 is not covered by liquid, so that the seal between the dielectric and the housing bottom is not constantly acted on by the liquid.

The housing 6 may be formed with a semicircular shape as shown in FIG. 3.

Suitable liquids, which are furthermore electrically conductive and suitably stable chemically, and furthermore do not attack the dielectric substance or the housing, are readily available. Thus, water, mercury and glycol can be used. A dielectric (9,10) having a wetting-reducing surface is preferably used, for instance unsintered PTFE (polytetrafluoroethylene).

In the acceleration sensor of the invention, the insulating layers of the dielectric which surround the electrodes can be made relatively thin so that high values of capacitance result. In one actually constructed acceleration sensor according to the invention, a filling height of 10 millimeters and a distance between the electrodes of also 10 millimeters was selected, which, depending on the type and thickness of the dielectric, resulted in capacitance values of 30 pF to 1,000 pF, which can be measured with relatively simple circuits.

FIG. 4 shows an equivalent circuit diagram of the acceleration sensor of the invention which consists of two capacitors of which the capacitances $C_1$ and $C_2$ which, corresponding to the above derivations, are a function of the acceleration acting on the acceleration sensor.

In the circuit shown in FIG. 5 two monostable flip-flops 14, 15 are provided which are so designed that the duration of the unstable state is proportional to a value $X_1$ or $X_2$ present as resistance or capacitance value, which values correspond in the present case to the capacitances $C_1$ and $C_2$. The output of each monostable flip-flop 14, 15 is connected via differentiating circuits 16, 17 and 18, 19 respectively to an inverting setting input (hereinafter called trigger input) of the other monostable flip-flop. In this way, one monostable flip-flop is in each case placed in the unstable state when the other one returns to the stable state.

Figure 6:
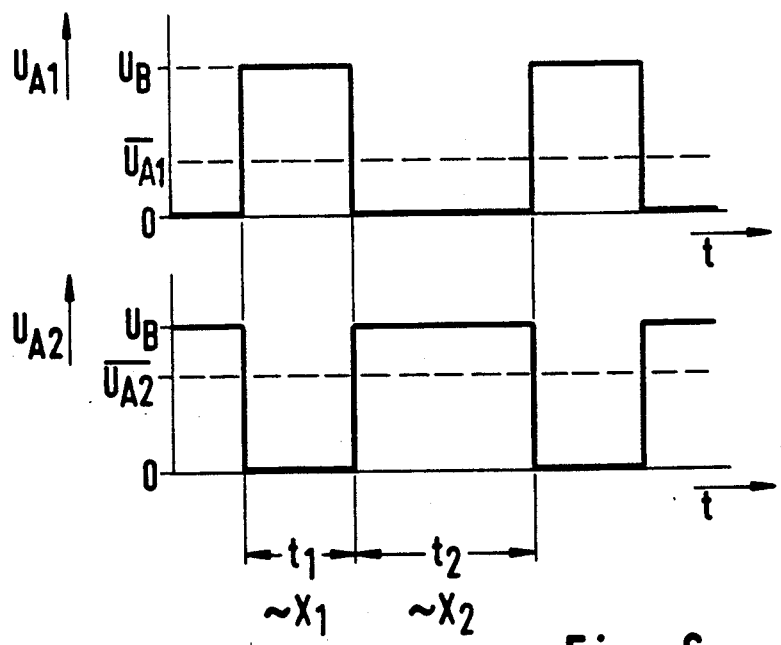
FIG. 6 shows the output signals of the monostable flip-flops.

Square signals then result at the outputs 20, 21 of the monostable flip-flops 14, 15, their course being shown in FIG. 6. The two periods of time $t_1$ and $t_2$ are in this case always proportional to the input variables $X_1$ and $X_2$.

If the difference between the variables $X_1$ and $X_2$ is evaluated, one obtains a reduction in the temperature sensitivity in the event that both variables have the same temperature course, namely, in the event that both capacitors drift the same amount with temperature. The reduction in temperature occurs because in a differential measurement the temperature offsets cancel. However, this is true only for the zero-point stability. For a reduction of the temperature course of the slope, the presence of inclination of the liquid surface, division by the temperature-dependent variables must still be effected. The division is a normalization obtained by dividing the differential capacitance (or capacitive reactance) by the sum of the capacitances (or capacitive reactances). In the evaluation circuit of the invention, such a signal is obtained in simple manner by subtracting the mean values as follows:

$$\overline{U_{A1}} - \overline{U_{A2}} = U_B \cdot (X_1 - X_2)/(X_1 + X_2).$$

In most sensors, particularly in those in which high resistances or small capacitances are evaluated (as in the acceleration sensor of the invention), the evaluation circuit is located close to the resistors or capacitors while a device which processes the output signals of the evaluation circuit is connected to the evaluation circuit by one or more lines. The output signals of the evaluation circuit of FIG. 5 form a good basis for transmission to the processing circuit, for instance a control device in an automobile. Depending on the specific requirements, the transmission from the evaluation circuit to the control device can take place in the form of a binary signal or in the form of an analog signal.

Figure 7:
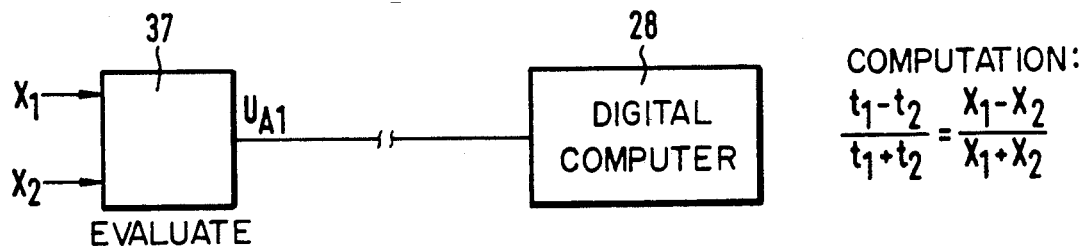
FIGS. 7a–7d show various circuits for transmitting the output signals of an evaluation circuit which is located in the immediate vicinity of a sensor to a processing circuit.
Figure 7:
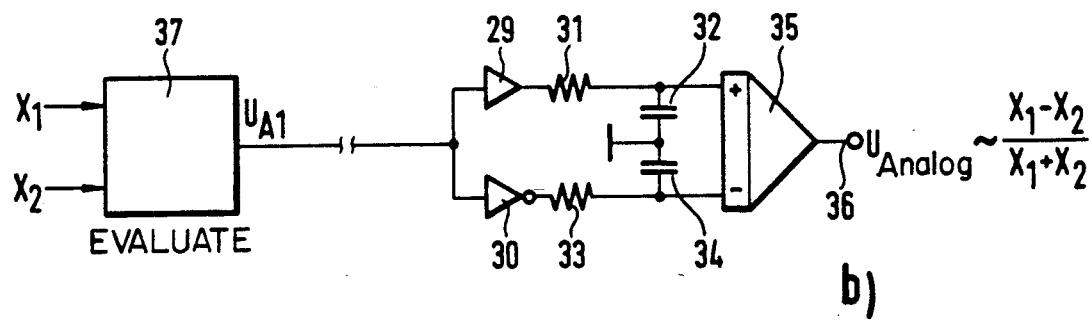
Figure 7:
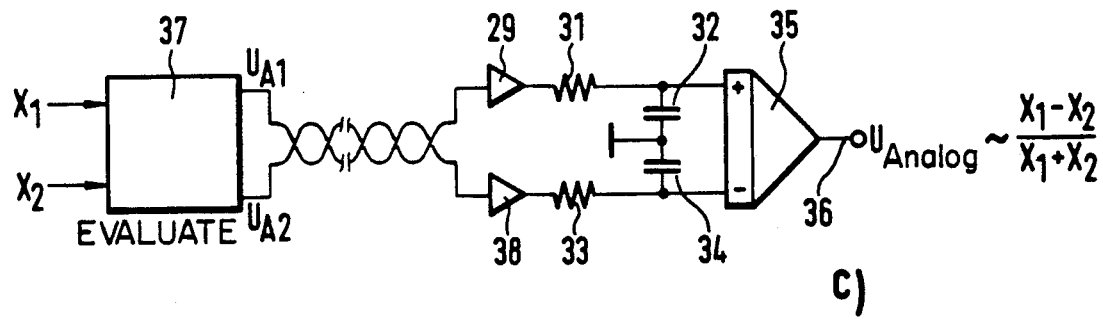
Figure 7:
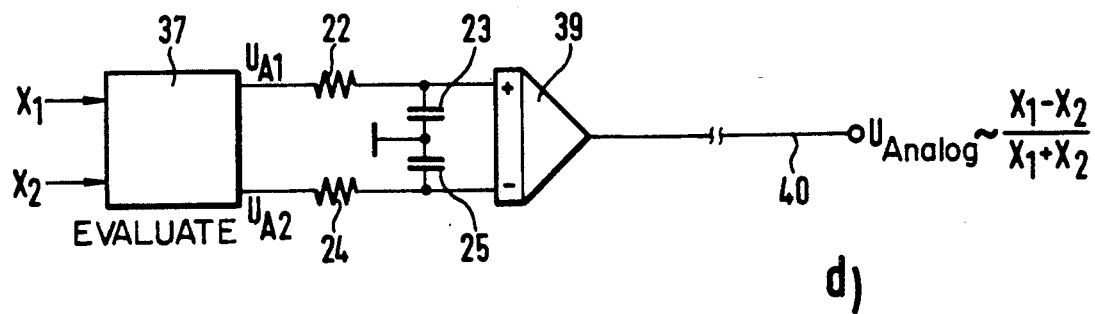

FIG. 7 shows several circuit arrangements for this. In FIG. 7a, one of the output signals $U_{A1}$ is transmitted in unchanged form, i.e. binary, by an evaluation circuit 37. On the receiver side, a digital computer 28 is provided by means of which the times $t_1$ and $t_2$ are measured, whereby the values $X_1$ and $X_2$ are recovered. The formation of a difference, sum and quotient can then take place in simple manner in the digital computer 28 so that a value $(X_1 - X_2)/(X_1 + X_2)$, normalization of the differential capacitance, is produced, which is directly compensated for by the normalization. The compensation occurs in the case of sensors whose output variable is formed by the difference of the two variables $X_1$ and $X_2$, and wherein $X_1$ and $X_2$ are subjected to a disturbing effect such as a temperature dependence.

The binary signal $U_{A1}$ is also transmitted in the case of the circuit shown in FIG. 7b. The further evaluation, however, takes place by means of an analog circuit which consists of an input amplifier 29, an inverter 30, an integrator comprising resistor 31 and capacitor 32, and an integrating element comprising resistor 33 and capacitor 34, and a difference amplifier 35. Due to the integration by means of the integrating member 31, 32, the mean value of the signal $U_{A1}$ is formed, which is proportional to $X_1/(X_1 + X_2)$. The mean value of the inverted signal is formed by the integrating member 33, 34 and corresponds to $X_2/(X_1 + X_2)$. The difference amplifier 35 then forms the desired result, which is present at the output 36 as analog signal.

While the circuit shown in FIG. 7b between the output of the evaluation circuit and the input of the control device represents an asymmetric binary interface, the circuit shown in FIG. 7c has a symmetric binary interface. For this purpose, the two outputs of the evaluation circuit are connected by one line each to the input amplifiers 29, 38 of the control device. The analog signal is formed, as in the case of the circuit arrangement of FIG. 7b, by integrating members 31, 32 or 33, 34 and a difference amplifier 35. The advantage consists in the freedom from interference upon transmission over long lines.

Finally, FIG. 7d shows a further possibility for signal transmission between an evaluation circuit and a control device, in which an analog signal is transmitted. For this purpose, an integrator comprising resistor 22 and capacitor 23 and an integrator comprising resistor 24 and capacitor 25, and a difference amplifier 39 are arranged in the region of the evaluation circuit 37. The control device is connected by a line 40.

Figure 8:
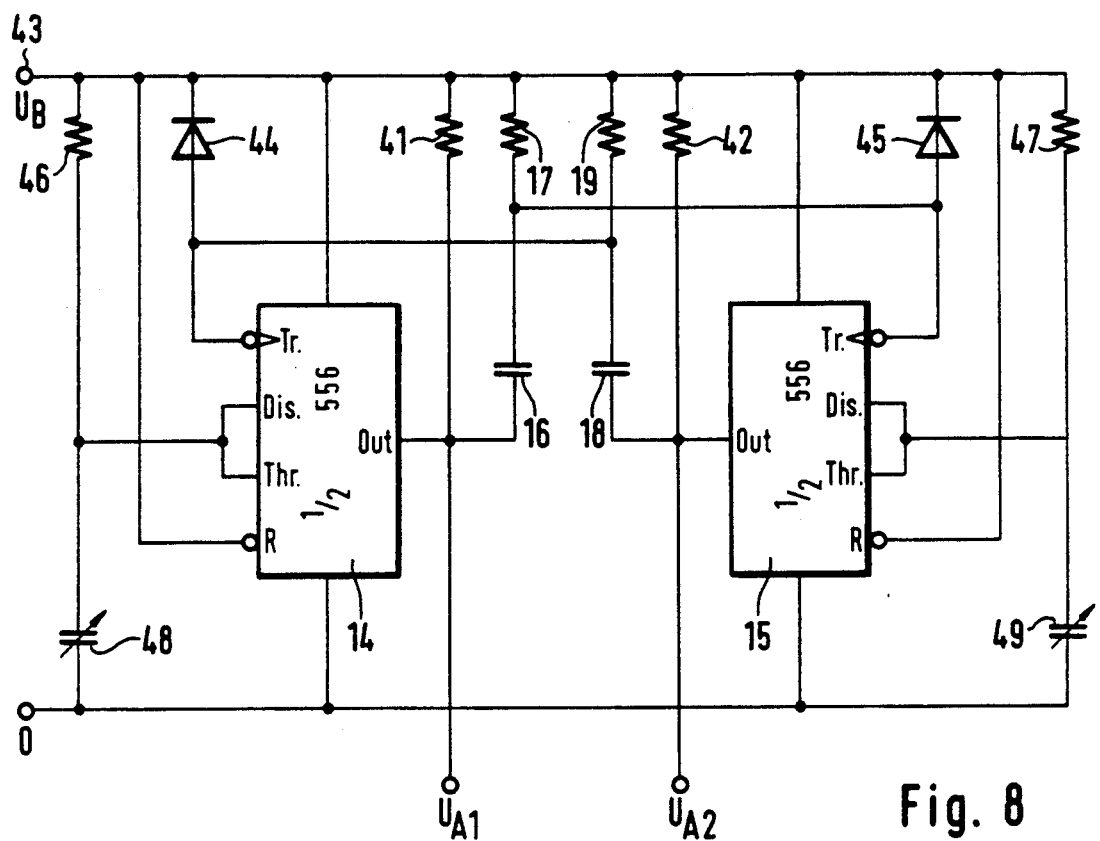
FIG. 8 is a circuit diagram of a first embodiment.

In the circuit arrangement shown in FIG. 8, the two monostable flip-flops 14, 15 are formed by an integrated module of Type Series 556 (dual clock circuit). As in the block diagram of FIG. 5, each of the outputs is connected via a differentiating circuit 16, 17 and 18, 19 respectively to the inverting trigger input of the other monostable flip-flop. Resistors 41 and 42 are connected between the terminal 43 for the operating voltage UB and the corresponding output and serve as working resistances. Each of the inverting trigger inputs is also connected by one diode 44, 45 each to the terminal 43 in order to limit the voltage at the trigger inputs.

The inputs Dis and Thr of the monostable flip-flops 14, 15 are connected to corresponding time constant members each of which consists of a resistor 46, 47 and a capacitor 48, 49 of variable capacitance. The capacitors 48, 49 are part of the acceleration sensor, in connection with which the capacitances are changed in opposite direction as a function of the variable to be measured. As already explained in connection with FIG. 5, the duration of the unstable state is proportional to the capacitance, whereby the output signals $U_{A1}$ and $U_{A2}$ are produced at the outputs of the monostable flip-flops 14, 15 in accordance with the diagram shown in FIG. 6.

Figure 9:
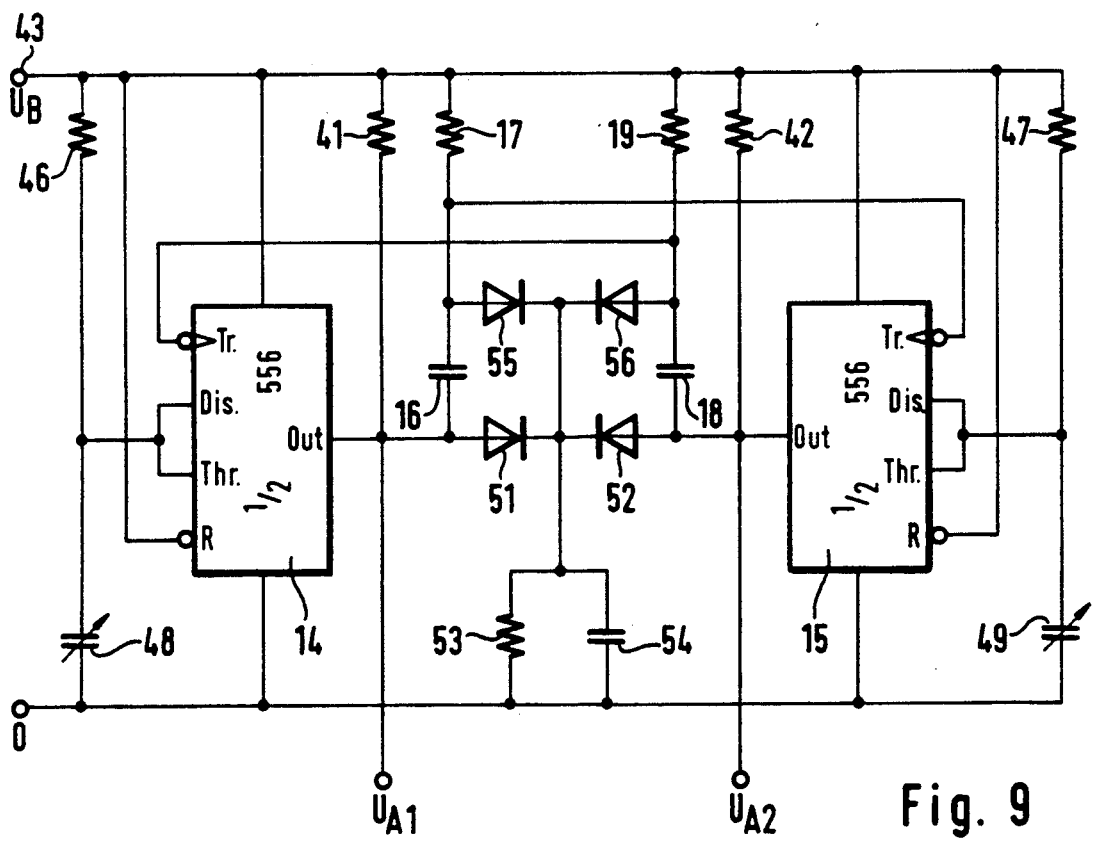
FIG. 9 is a circuit diagram of another embodiment of the evaluation circuit according to FIG. 5.

The circuit arrangement shown in FIG. 8 starts to oscillate only if the speed of rise of the operating voltage exceeds a predetermined value upon the connection. In the case of a brief interruption of the oscillation, for instance by a short-circuit or by the action of an interference pulse, the circuit does not start to oscillate again. In order to make dependable starting of the oscillation possible, the circuit arrangement shown in FIG. 9 is developed further in advantageous manner as compared with the circuit arrangement of FIG. 8.

For this, the outputs of the monostable flip-flops 14, 15 are connected to ground potential via respective diodes 51 and 52 and a common resistor 53. The diodes 51, 52 act as OR-connection of the signals $U_{A1}$ and $U_{A2}$. Due to the fact that $U_{A1}$ and $U_{A2}$ are inverted with respect to each other, the voltage $U_{53}$ at the resistor 53 amounts to $U_B - 0.7V$ upon oscillation of the circuit at any time. A capacitor 54 smooths any peaks which are produced while the flanks (leading and trailing edges of a pulse waveform) of $U_{A1}$ and $U_{A2}$ are produced.

If there is no oscillation, the output voltages $U_{A1}$ and $U_{A2}$ are at ground potential and both diodes 51, 52 block. The voltage $U_{53}$ and the voltages at the trigger inputs are then determined by the resistors 17, 19 of the diodes 55, 56, which then become conductive, and by the resistor 53. The voltages at the trigger inputs thus drop to the value $U_{tr} = (U_B - 0.7V)/(1 + R_{17}/R_{53}) + 0.7V$. By the selection of the values $R_{17}$ and $R_{53}$ of the resistors 17 and 53, $U_{tr}$ is set below the value specified in the data sheet of the monostable flip-flop. As a result, both output signals are again transferred to the unstable state and the starting assistance effected by the diodes is terminated.

In addition to their function as starting assistance, the diodes 55, 56 also serve to limit the voltages fed to the trigger inputs so that they do not rise above the operating voltage $U_B$. The dimensioning of the resistors 17 or 19 and 53 respectively takes place in accordance with the following equation:

$$R_{17(19)}/R_{53} \geq (U_B - 0.7V)/(U_{tr} - 0.7V) - 1,$$

in which $U_B = 5V$ and $U_{tr} \geq 1.26V$ when using the 556 module. From this there results $R_{17(19)}/R_{53} \geq 6.68$. In one circuit arrangement used in actual practice, $R_{17} = R_{19} = 47$ kOhms and $R_{53} = 6.8$ kOhms.

The differentiating circuits 16, 17, 18, 19 have the task of deriving a short pulse which characterizes the dropping flank of the instantaneous output signal. For this a time constant is required which is substantially less than the duration of the unstable conditions of the monostable flip-flops. We thus have the following condition: $R_{17} \cdot C_3 << R_{46} \cdot C_{48}$, which applies by analogy also for the elements 18, 19, 47 and 49.

I claim:

1. An acceleration sensor comprising
   a housing partly filled with an electrically conductive liquid the surface of which becomes inclined under the influence of acceleration forces having at least a horizontal component;
   two electrically conductive electrodes coated with a dielectric and arranged substantially parallel and in spaced apart relationship to each other, the two electrodes being immersed to about one half of their length into said conductive liquid; and
   a set of three terminals wherein a first of said terminals is connected to a first of said electrodes, a second of said terminals is connected to a second of said electrodes, and a third of said terminals is connected electrically to said liquid;
   wherein the dielectric between a first of the electrodes and the liquid forms a first capacitor, the dielectric between a second of the electrodes and the liquid forms a second capacitor, capacitances of the first and the second capacitors being inversely affected by inclination of a surface of the liquid due to acceleration of the sensor.

2. An acceleration sensor according to claim 1, wherein said housing is electrically conductive, and said third terminal is connected to the housing.

3. An acceleration sensor according to claim 2, further comprising a third uncoated electrode immersed in said liquid and connected to said third terminal; and wherein said housing is electrically nonconductive.

4. An acceleration sensor according to claim 2, further comprising
   a subtraction circuit having a first input portion connected between said first and said third terminals and a second input portion connected between said second and said third terminals;
   wherein said sensor further comprises a device connected to an output of said subtraction circuit for measuring a difference of capacitance between said first and said second capacitors.

5. An acceleration sensor according to claim 1, wherein
   said dielectric has a wetting-reducing surface.

6. An acceleration sensor according to claim 5, wherein said dielectric is unsintered PTFE.

7. An acceleration sensor according to claim 1, wherein
   the electrodes are coated, with the dielectric being a dielectric ceramic, glass, or insulating varnish, coating by the dielectric providing a high dielectric coefficient.

8. An acceleration sensor comprising
   a housing partly filled with an electrically conductive liquid the surface of which becomes inclined under the influence of acceleration forces having at least a horizontal component;
   two electrically conductive electrodes coated with a dielectric and arranged substantially parallel and in spaced apart relationship to each other, the two electrodes being immersed to about one half of their length into said conductive liquid; and a set of three terminals wherein a first of said terminals is connected to a first of said electrodes, a second of said terminals is connected to a second of said electrodes, and a third of said terminals is connected electrically to said liquid;

wherein the dielectric between a first of the electrodes and the liquid forms a first capacitor, the dielectric between a second of the electrodes and the liquid forms a second capacitor, capacitances of the first and the second capacitors being inversely affected by inclination of a surface of the liquid due to acceleration of the sensor;

the sensor further comprising two monostable flip-flops having time-constant elements including a capacitive reactance element, said first capacitor serving as the reactance element for a first of the flip-flops and said second capacitor serving as the reactance element for a second of the flip-flops; and wherein the resistance and capacitance values in each said capacitive reactance element determine the time constants of the respective monostable flip-flops; and one output of one monostable flip-flop is connected to a trigger input of the other monostable flip-flop in such a manner that upon passage of the one flip-flop into the stable state, the other flip-flop passes into the unstable state.

9. An acceleration sensor according to claim 8, further comprising
a plurality of differentiating circuits, and
wherein the outputs of the monostable flip-flops are connected to the respective trigger inputs via said differentiating circuits.

10. An acceleration sensor according to claim 9, further comprising an integrator, and
wherein the output signal of at least one of said monostable flip-flops is fed to said integrator.

11. An acceleration sensor according to claim 8, further comprising an integrator, and
wherein the output signal of at least one of said monostable flip-flops is fed to said integrator.

12. An acceleration sensor according to claim 8, further comprising a subtraction circuit and a plurality of integrators, and wherein each of the output signals of the respective flip-flops is fed to a separate one of said integrators; and
outputs of the integrators are connected inputs of said subtraction circuit.

13. An acceleration sensor according to claim 9, further comprising a subtraction circuit and a plurality of integrators, and
wherein each of the output signals of the respective flip-flops if fed to a separate one of said integrators; and
outputs of the integrators are connected to the inputs of said subtraction circuit.

14. An acceleration sensor according to claim 8, further comprising a subtraction circuit and a plurality of integrators, and
wherein an output signal of one monostable flip-flop is fed directly to a first of said integrators, is inverted, and is fed to a second of said integrators; and
the outputs of the integrators are connected to inputs of said subtraction circuit.

15. An acceleration sensor according to claim 13, further comprising means for monitoring oscillation, and
wherein the oscillation of at least one said flip-flops is monitored and, upon absence of the oscillation, at least one flip-flop is again placed into the unstable state via the corresponding trigger input.

16. An acceleration sensor according to claim 15, wherein
said oscillation monitoring means comprises a logical OR connection of the two output signals of the flip-flops.

17. An acceleration sensor according to claim 9, further comprising a plurality of diodes, and wherein
each of the differentiating circuits comprises one capacitor and one resistor, which is connected to a terminal for the operating voltage; and
both terminals of each capacitor belonging to a differentiating circuit are connected via said diodes, one diode each, to a resistor having a terminal facing away from the diodes to be acted on by ground potential.

* * * * *